(12) United States Patent
Galiteva

(10) Patent No.: US 11,631,947 B2
(45) Date of Patent: Apr. 18, 2023

(54) FAIL PROOF ELECTRICAL CONNECTOR APPARATUS FOR SOLAR PHOTOVOLTAIC MODULES

(71) Applicant: Angelina Mincheva Galiteva, Fountain Valley, CA (US)

(72) Inventor: Angelina Mincheva Galiteva, Fountain Valley, CA (US)

(*) Notice: Subject to any disclaimer, the term of this patent is extended or adjusted under 35 U.S.C. 154(b) by 201 days.

(21) Appl. No.: 17/214,662

(22) Filed: Mar. 26, 2021

(65) Prior Publication Data
US 2021/0305741 A1    Sep. 30, 2021

Related U.S. Application Data

(60) Provisional application No. 63/000,209, filed on Mar. 26, 2020.

(51) Int. Cl.
| | |
|---|---|
| H01R 24/76 | (2011.01) |
| H01R 13/11 | (2006.01) |
| H02S 40/34 | (2014.01) |
| H02G 3/16 | (2006.01) |

(52) U.S. Cl.
CPC .......... *H01R 13/111* (2013.01); *H01R 24/76* (2013.01); *H02G 3/16* (2013.01); *H02S 40/34* (2014.12)

(58) Field of Classification Search
CPC ....... H01R 13/111; H01R 24/76; H01S 40/34; H02G 3/16; Y02E 10/50
See application file for complete search history.

(56) References Cited

U.S. PATENT DOCUMENTS

| | | | |
|---|---|---|---|
| 7,737,355 B2 | 6/2010 | Nieleck et al. | |
| 8,462,518 B2* | 6/2013 | Marroquin | H02M 7/44 |
| | | | 361/733 |
| 8,512,050 B2 | 8/2013 | McGreevy | |
| 8,558,102 B2 | 10/2013 | Croft et al. | |
| 8,907,230 B2 | 12/2014 | Chen | |
| 9,780,723 B2 | 10/2017 | Gingrich, III et al. | |
| 10,476,429 B2 | 11/2019 | Mostoller | |
| 10,511,258 B2* | 12/2019 | Feldmann | H02S 40/30 |
| 2008/0194154 A1* | 8/2008 | Minnick | H01R 13/111 |
| | | | 439/842 |
| 2015/0144181 A1* | 5/2015 | Gilchrist | H05K 3/301 |
| | | | 136/251 |
| 2017/0373635 A1* | 12/2017 | Perez | H02S 30/10 |

* cited by examiner

*Primary Examiner* — Tho D Ta

(57) ABSTRACT

A fail proof electrical connector apparatus offers a unique structure for solar photovoltaic (PV) system installations. The apparatus includes a compact connector enclosure that can be installed at flexible locations of a solar module. The tabs of the connector enclosure connect to various solar cells of the module. The insertion pins of the tabs are mounted inside plugs of a pin connector, which connects to a cable. The cable comprises a one-plug end and a multiple-plug end with a wire connecting both. Of the two or more plugs of the multiple-plug end, only one active plug is electrically connected to the wire. The cable is connected to the module with the active plug being inserted to a center plug of the pin connector, and the one-plug end connected to an outer plug of the pin connector of an adjacent module, thus, achieving fail proof, reliable installations while saving labor hours.

15 Claims, 9 Drawing Sheets

FAIL PROOF ELECTRICAL CONNECTOR APPARATUS FOR SOLAR PHOTOVOLTAIC MODULES

The current application claims a priority to the U.S. Provisional Patent application Ser. No. 63/000,209 filed on Mar. 26, 2020.

FIELD OF THE INVENTION

The present invention relates generally to solar photovoltaic (PV) energy generation systems. More specifically, the present invention relates to an innovative, fail proof electrical connector apparatus for reliably, efficiently, and effectively interconnecting solar PV modules.

BACKGROUND OF THE INVENTION

The reliability and durability of an electrical connector assembly, normally exchangeably named "junction box" or "J-box" or "JB," is critical for the continuous and safe operation of solar photovoltaic (PV) energy generation systems. Actual field statistics, however, revealed that the junction box used in solar PV systems not only have had significantly high failure rates, but also usually caused severe safety and warranty problems through the service lifetime of the solar systems. Junction box reliability problems are not just a regional issue, but rather a global one. Further, the majority of junction box failures is the result of system installation including wiring and cabling of the PV modules, also interchangeably called panels. Other factors such as module manufacture and junction box supplier, etc., contribute much less to the junction box failures.

A recent trend shows that as more adults seriously consider solar PV systems, more and more homeowners are seeking to perform the PV installation themselves. These inexperienced installers, being either new to the market or unlicensed or both, may produce significantly failure-prone PV systems with high probabilities of junction faults in the solar PV system operations. Additionally, the continuous driving force of cutting installation costs to gain high profits for PV projects may cause potential installation problems of junction boxes even when highly trained and licensed installers are used. Thus, it is even more crucial to achieve and maintain the quality and safety of solar installations through innovative designs of junction boxes and efficient and simplified installation methods.

Normally, the solar junction box is an enclosure mounted on the underside of a solar PV module, also called solar back layer. The solar junction box is an essential component of the solar system through which two or more solar PV modules are interconnected. The solar junction box is the output interface of the solar module. A conventional solar junction box has two output terminals, a direct current (DC) positive (+) and a DC negative (−). These two output terminals are connected to the solar PV modules in the system through either a series pattern, solar modules are wired together by connecting the positive lead of one PV module/panel to the negative lead of another PV module/panel to increase the voltage of the string, or a parallel pattern, the positive leads of two or more modules connected and the negative leads connected. The junction boxes of the solar modules are connected through cables which transport the electricity generated by the solar module to the string, i.e., a series-connected set of solar modules. Additionally, the conventional solar junction boxes normally encapsulate solar bypass diodes that keep solar power flowing in one direction and prevent it from flowing back to the solar modules when the solar module is shaded and not generating electricity.

Many conventional designs of solar junction boxes offer large profiles and feature installations of junction boxes underneath the modules. These conventional designs also make module connection cables grouped under the modules and the output terminals of the solar modules connected with the junction boxes with additional cables, thus making crowded cable/wire bundles under the modules and increasing the potential wiring issues and faults for the solar system. Such issues and faults include open circuit, loose electrical connections, burnt output terminals, burnt junction boxes, burnt bypass diode, low power output, etc. Some of the more recent solar junction boxes installed on the edges of solar modules are getting complicated and make maintenance and repair of the solar system difficult.

Thus, it is the objective of the present invention to provide a solution to the aforementioned problems, issues, and drawbacks of the existing solar junction boxes. The present invention offers a fail proof, efficient, effective and easy to use electrical connector assembly/apparatus. The innovative connector apparatus of the present invention significantly reduces the wiring complexity and demand for related installation training of solar systems. Further, the present invention substantially improves the reliability and durability of the solar junction boxes and wiring, thus the whole solar PV system.

SUMMARY OF THE INVENTION

The present invention comprises a fail proof electrical connector apparatus for solar photovoltaic (PV) system. The connector apparatus of the present invention offers an innovative device and connection method for an installer of solar PV modules to significantly reduce wiring labor hours and improve the reliability of the solar system. Additionally, the present invention features an efficient and straightforward junction box structure and cabling mechanism to interconnect the solar modules in the system, thus reducing or eliminating extensive training required and enabling a user to create a clean and well-organized overall wiring of the system.

The connector apparatus of the present invention includes a connector enclosure that features a compact structure, which enables the user to install the present invention either on the back of a solar module as a conventional installation or at the edge of either top or back side of the solar module. The connector enclosure provides exposed tabs so that all solar cells of the solar module can be conveniently connected to the present invention. The tabs comprise insertion pins that are mounted inside plugs of a pin connector, which is positioned on the connector enclosure. With the plugs being physically and electrically connected to the pins of the tabs, the pin connector provides output terminals of the solar module. A separate cable assembly of the connector apparatus of the present invention is then used to connect the solar module with an adjacent solar module. The cable assembly comprises a one-plug end and a multiple-plug end with a wire in between connecting both ends. The multiple-plug end may comprise two or more plugs that are physically attached to the wire but only one plug is electrically connected to the wire. The plug being electrically connected to the wire may be, but is not limited to, the outermost plug, thus eliminating any potential electrical short while avoiding any exposed plugs during installation when interconnecting solar modules in the system. Therefore, the interconnection can be made by conveniently plugging the multiple-plug end of the cable assembly to the current solar module with inserting the outermost plug to the center plug of the pin connector, and the one-plug end to an outer plug of the pin connector of the adjacent solar module. Further, at least one bypass diode and a light-emitting diode (LED) light are provided in the connector enclosure. The at least one bypass diode keeps current of the generated solar power flowing in one direction and prevents this current from flowing back to the solar modules thus eliminating damages and failures of the solar PV system. The optional LED light sends alerts whenever the at least one bypass diode fails and/or malfunctions to ensure fast, easy repair or replacement of the failing solar module/panel. Through the unique construction and structure of the connector apparatus, the present invention achieves fail proof installation of solar modules with the efficient and effective mechanism that saves substantial labor hours for field installation, installer training, troubleshooting, maintenance, and costly repairs of the operation of the solar PV system.

DETAIL DESCRIPTIONS OF THE INVENTION

Figure 1:
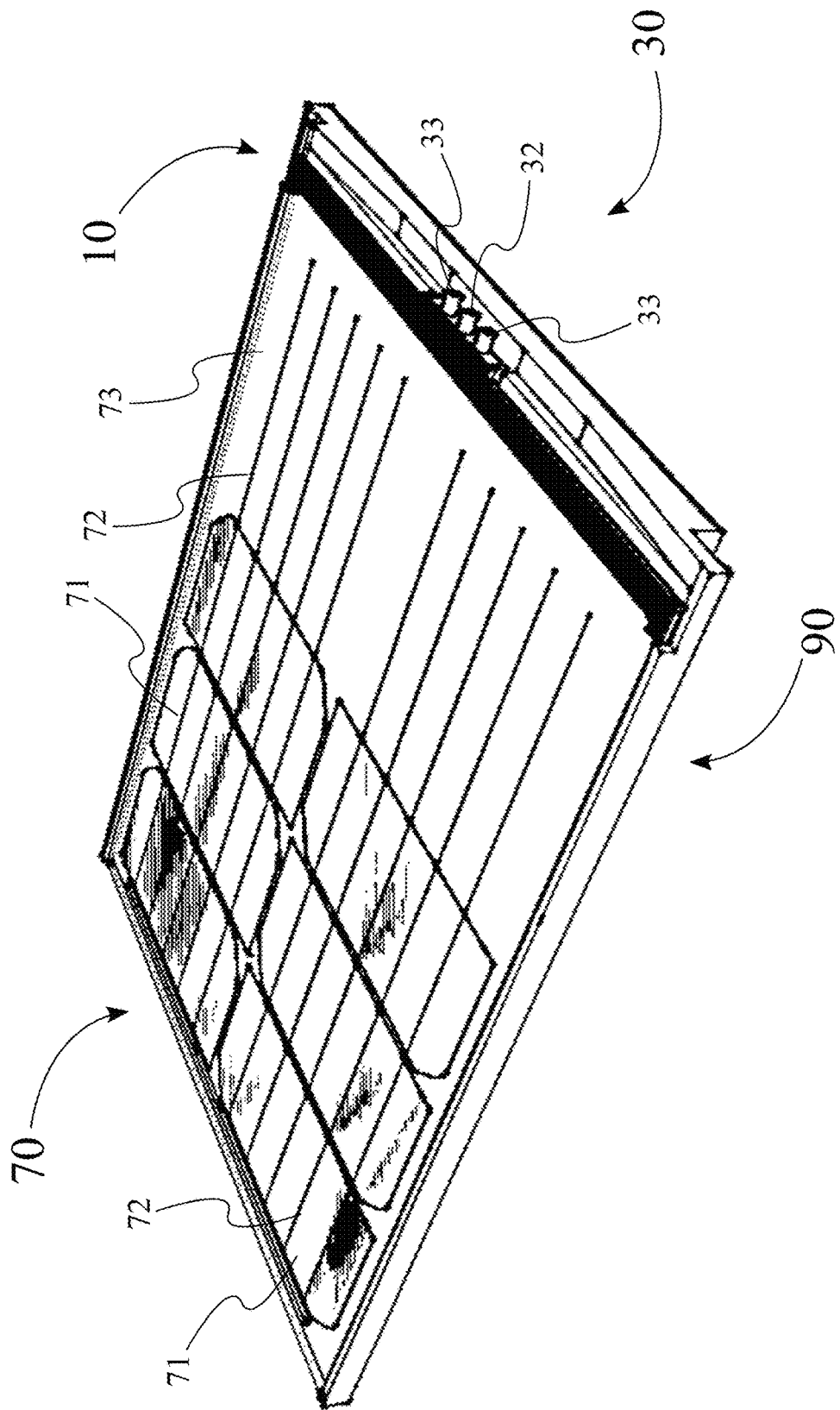
FIG. 1 is a top perspective view of a solar module with an electrical connector enclosure of the present invention, wherein the electrical connector enclosure is installed on the top surface of the solar module.

All illustrations of the drawings are for the purpose of describing selected versions of the present invention and are not intended to limit the scope of the present invention.

As can be seen in FIG. 1 to FIG. 9, the present invention comprises a fail proof electrical connector apparatus for solar photovoltaic (PV) systems. The fail proof connector of the present invention comprises a connector enclosure 10, a pin connector 30, a cable assembly 50, a plurality of solar modules 70, and a module base 90. The module base 90 is the support substrate upon which the whole solar PV system is installed, including, but not limited to, a roof, a platform, a frame, and any suitable structure, etc. The plurality of solar modules 70 is mounted on the module base 90. Additionally, the plurality of solar modules 70 is distributed across the module base 90, via a specific design of the solar PV system. The connector enclosure 10 is attached to the module base 90 adjacent to a specific solar module of the plurality of the solar modules 70. Additionally, the connector enclosure 10 comprises a first tab 18 and a second tab 21, both of which are electrically connected to the specific solar module 70. The pin connector 30 comprises a center plug 32 and a plurality of outer plugs 33. The center plug 32 is centrally positioned on the pin connector 30 and the plurality of outer plugs 33 is distally positioned on the pin connector 30 adjacent the center plug 32. Additionally, the center plug 32 is connected to the second tab 21 of the connector enclosure 10, and the plurality of outer plugs 33 is connected to the first tab 18 of the connector enclosure 10. The cable assembly 50 comprises a plurality of cable plugs 52, an end plug 53, and a wire 55. The end plug 52 is terminally positioned on the wire 55. The plurality of cable plugs 53 is distally positioned on the wire 55, opposite the end plug 53. Additionally, the plurality of cable plugs 52 is connected to the center plug 32 and a corresponding plug of the plurality of outer plugs 33 of the pin connector 10. Further, the end plug 53 is connected to a vacant plug of the plurality of outer plugs 33 of the pin connector 30 mounted on the connector enclosure 10 of an adjacent solar module of the specific solar module 70.

Figure 2:
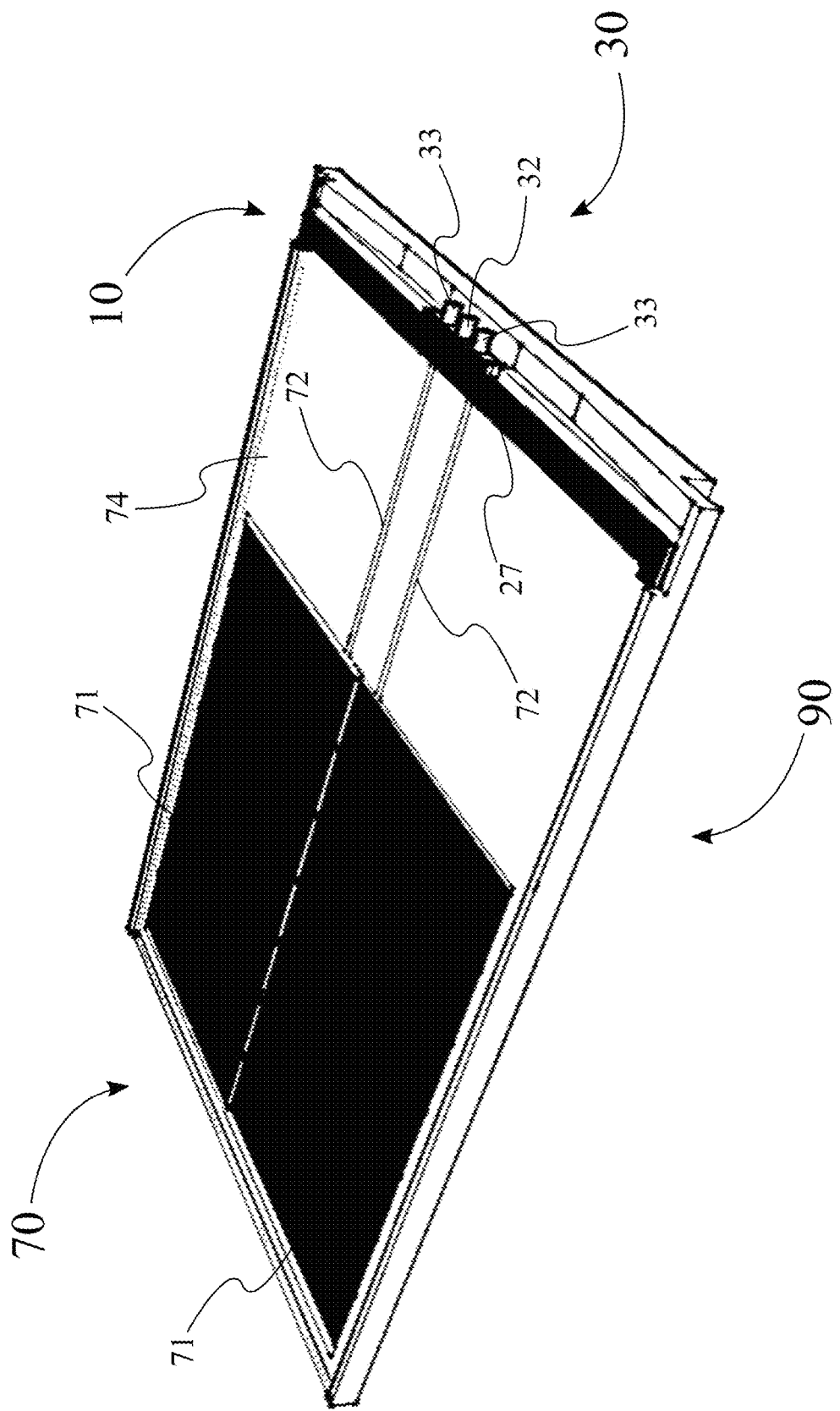
FIG. 2 is a top perspective view of an alternative embodiment of the solar module with the electrical connector enclosure of the present invention, wherein the electrical connector enclosure is installed on the bottom surface of the solar module.
Figure 3:
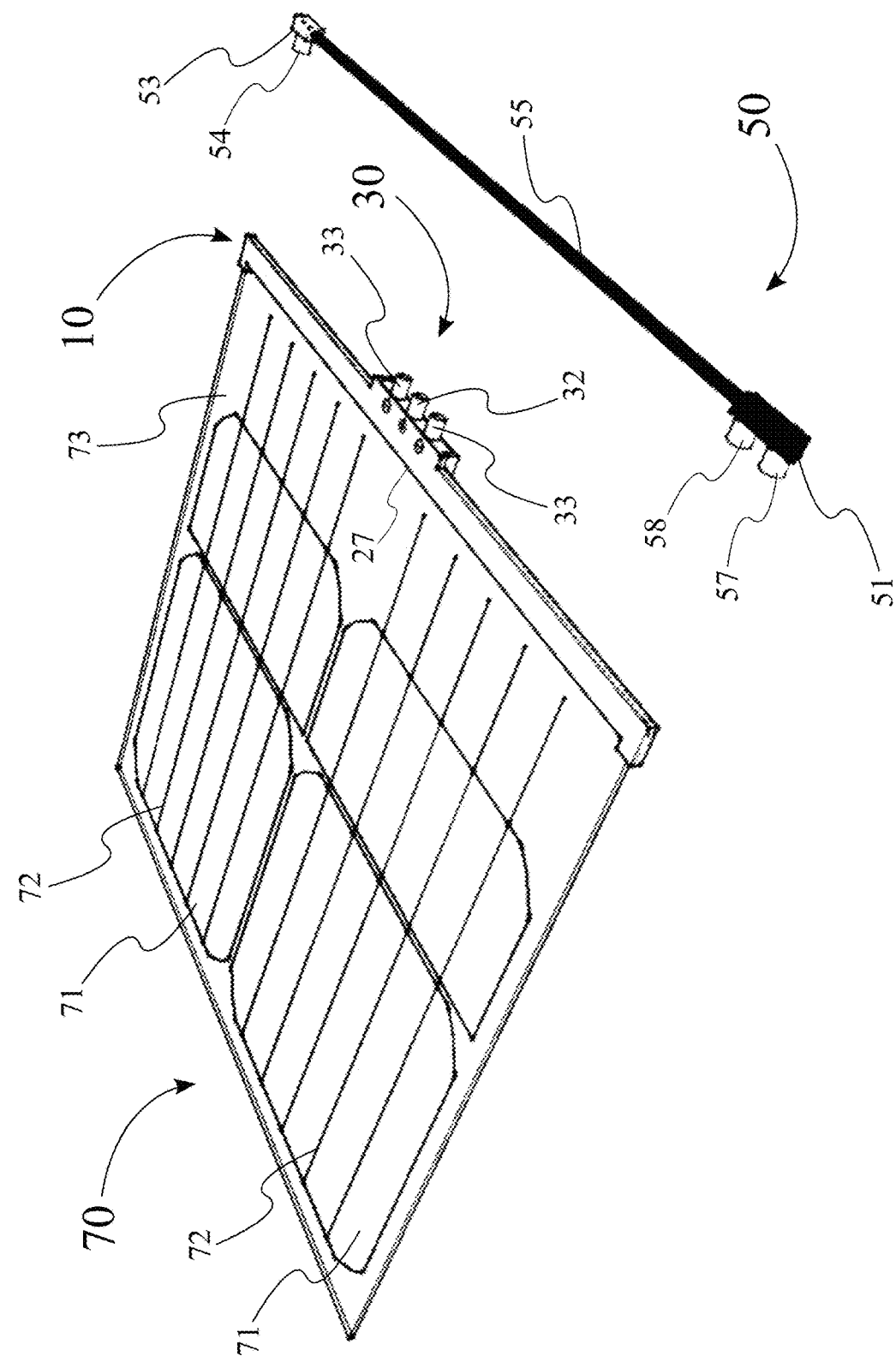
FIG. 3 is a top perspective view of the solar module with the electrical connector enclosure and a cable assembly of the present invention.

As can be seen in FIG. 1 and FIG. 2, the plurality of solar modules 70 is distributed across the module base 90 and comprises a plurality of solar cells 71. Each of plurality of solar cells 71 comprises a plurality of cell tabs 72, which provides the output circuit to the cell for transporting current of solar energy created by the solar cell. Additionally, the plurality of cell tabs 72 of approximately half the number of the plurality of solar cells 70 is connected to the first tab 18 of the connector enclosure 10, and the plurality of cell tabs 72 of the remaining solar cells 71 is connected to the second tab 21 of the connector enclosure 10.

As can be seen in FIG. 1 to FIG. 5, the connector enclosure 10 comprises a cover 11, a cavity frame 13, a main frame 15, a center cavity 17, a back slot 27, at least one bypass diode 23, and a light-emitting diode (LED) light 24. Specifically, the cover 11 is terminally mounted to the connector enclosure 10. The main frame 15 is terminally mounted to the connector enclosure 10, opposite the cover 11. The center cavity 17 centrally positioned on the main frame 15. The cavity frame 13 is securely mounted between the cover 11 and the main frame 15. The cavity frame 13 comprises a plurality of matching holes 14, a tab cavity 25, and a center cover 26. The center cover 26 is centrally positioned on the cavity frame 13. Both the first tab 18 and the second tab 21 are internally positioned in the tab cavity 25. Additionally, the first tab 18 comprises a plurality of pins 19. The plurality of pins 19 is distally positioned on the first tab 18. The second tab 21 comprises a second tab pin 22, which is terminally positioned on the second tab 21. Further, both the plurality of pins 19 and the second pin 22 are internally positioned in the center cavity of the main frame 15. The cover 11 comprises a plurality of holes 12. The main frame 15 comprises a plurality of threaded holes 16.

Figure 4:
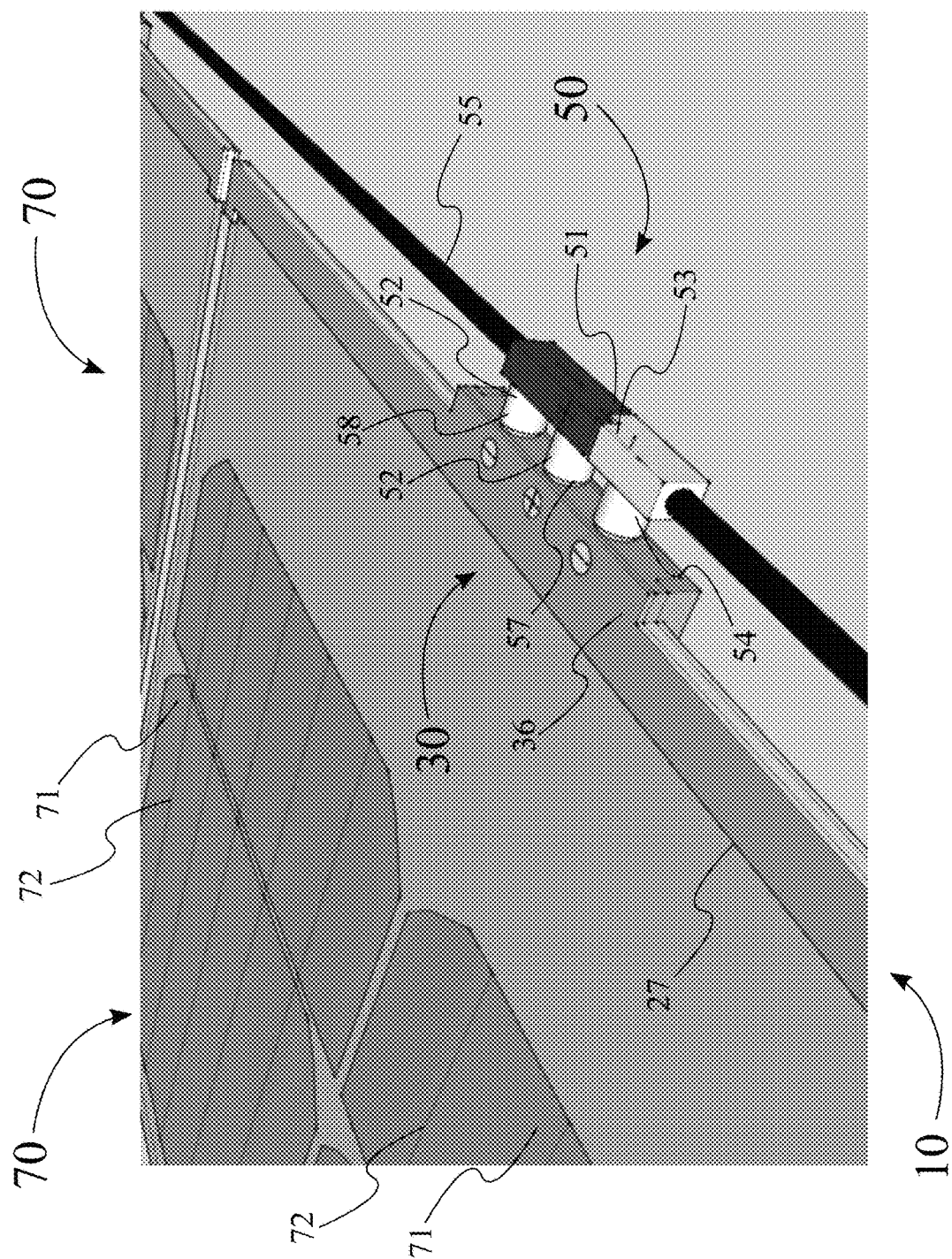
FIG. 4 is a blown-up top perspective view of the solar module with the cable assembly being connected to the electrical connector enclosure of the present invention.
Figure 5:
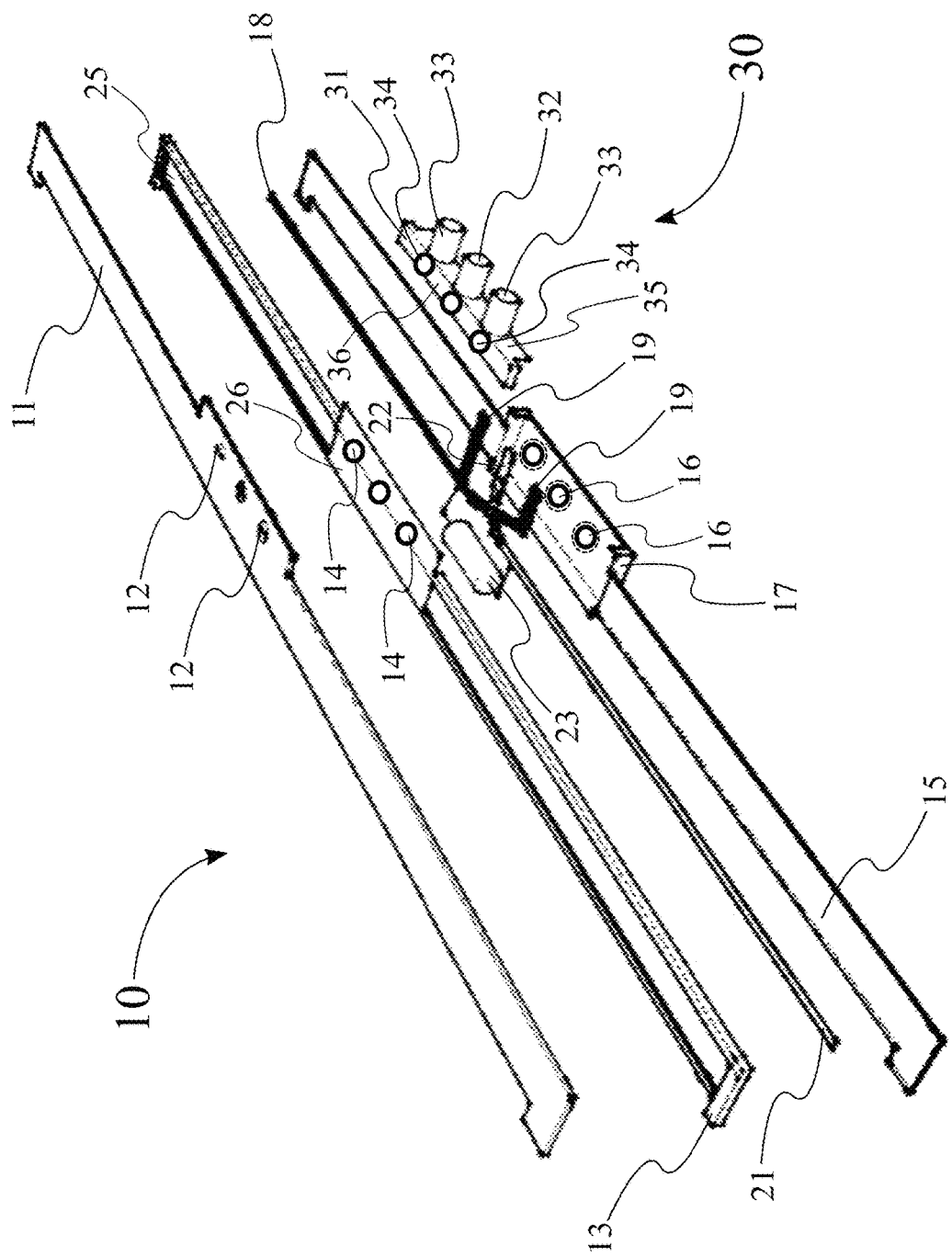
FIG. 5 is an exploded perspective view of the electrical connector enclosure of the present invention.
Figure 6:
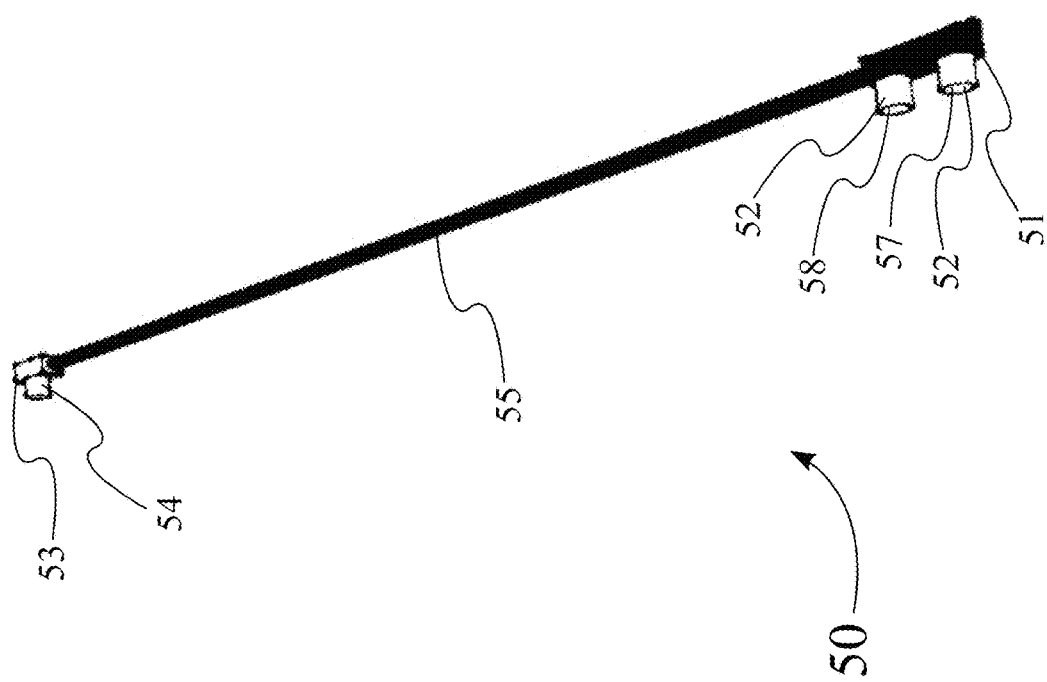
FIG. 6 is a top perspective view of the cable assembly of the present invention.
Figure 7:
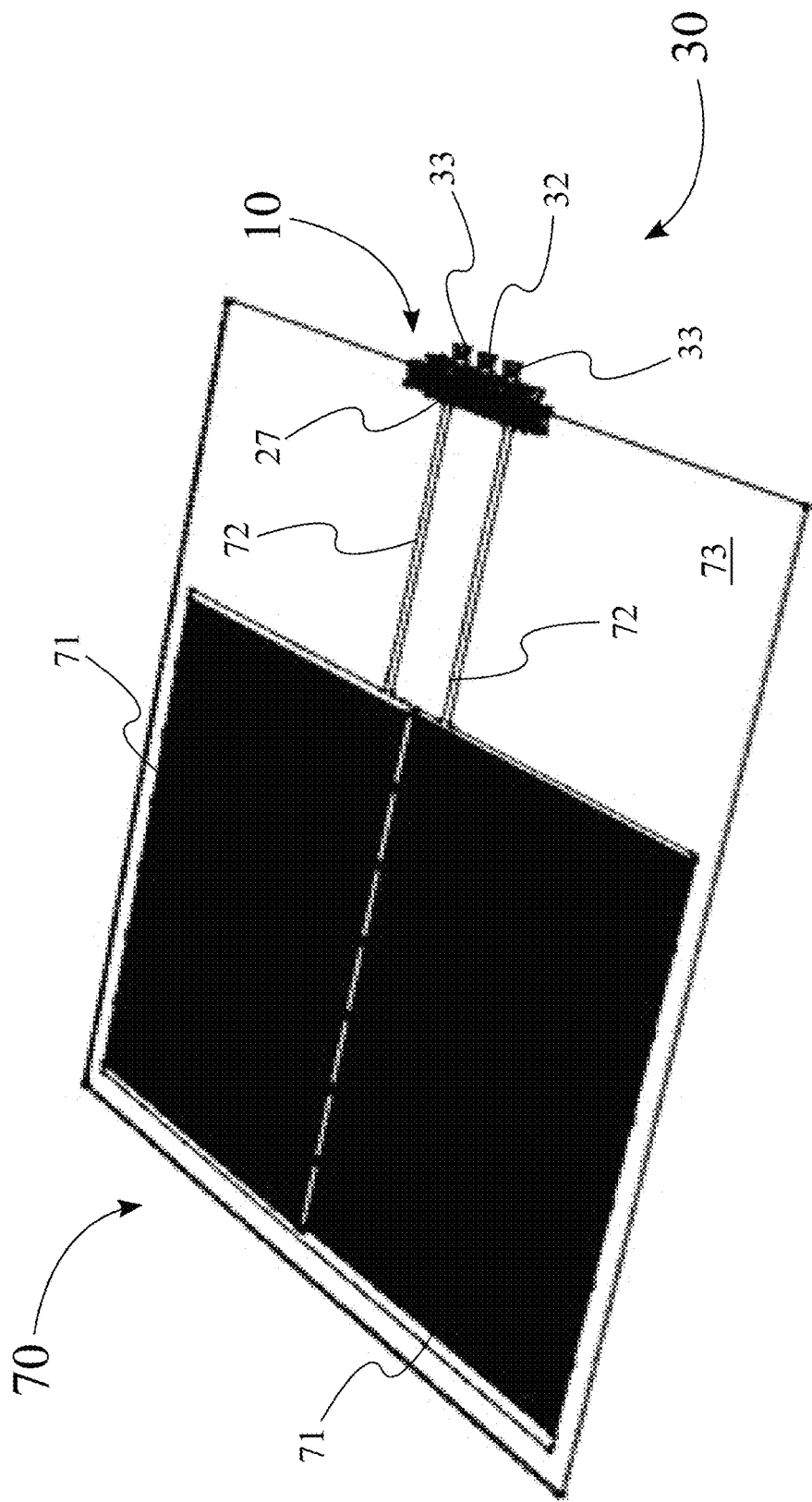
FIG. 7 is a top perspective view of the solar module with an alternative embodiment of the electrical connector enclosure of the present invention, wherein the electrical connector enclosure is installed on the top surface of the solar module.
Figure 8:
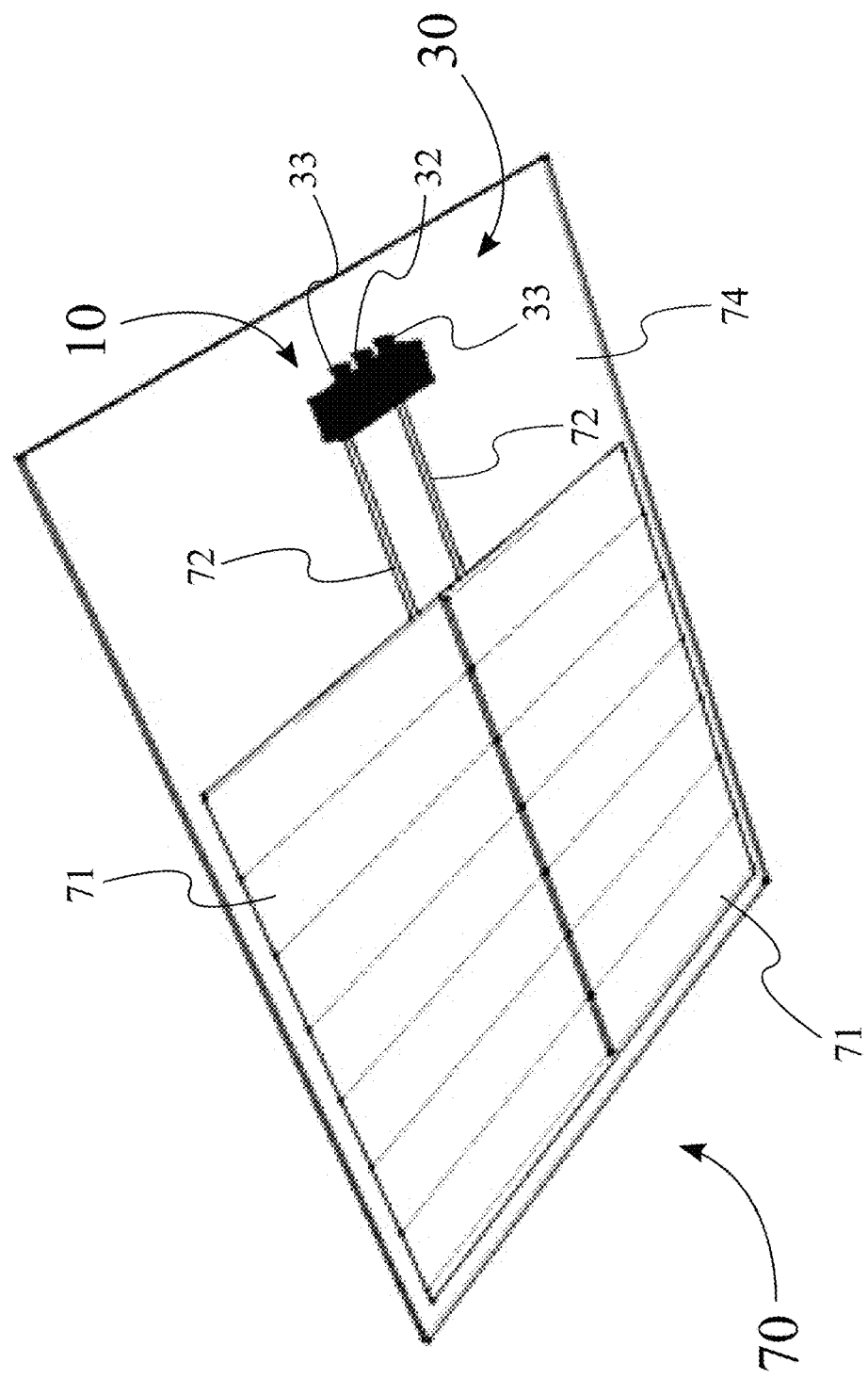
FIG. 8 is a bottom perspective view of the solar module with the alternative embodiment of the electrical connector enclosure of the present invention, wherein the electrical connector enclosure is installed on the bottom surface of the solar module.

As can be seen in FIG. 4 to FIG. 5, the pin connector 30 comprises a pin connector body 31 and a plurality of pin connector holes 34. More specifically, the pin connector body 31 comprises a front face 35 and a top face 36. Both the center plug 32 and the plurality of outer plugs 33 are terminally positioned on the front face 35. The top face 36 is positioned on the pin connector body 31 normal to and adjacent the front face 35. The plurality of pin connector holes 34 is distributed across the top face 36. Further, the pin connector 30 is mounted to the connector enclosure 10 through the top face 36 securely mounted between the main frame 15 and the cavity frame 13. Each of the plurality of pins 19 of the first tab 18 of the connector enclosure 10 is connected to a corresponding outer plug of the pin connector 30, and the second tab pin 22 of the second tab 21 of the connector enclosure 10 is connected to center plug 32 of the pin connector 30. In some embodiments of the present invention, the top face 36 of the pin connector 30 is inserted in between the center cavity 17 of the main frame 15 and the center cover 26 of the cover frame 13 of the connector enclosure 10, while the pins of the first tab 18 and second tab 21 being connected to the corresponding plugs of the pin connector 30. The connector apparatus of the present invention is enclosed and securely sealed through the aligned holes of the plurality of holes 12 of the cover 11, the plurality of matching holes 14 of the cavity frame 13, the plurality of pin connector holes of the top face 36 of the pin connector 30, and the plurality of threaded holes 16 of the main frame 15 of the connector enclosure 10. Mechanical fastening using means including, but not limited to screws, etc., may be used for securing the connector enclosure 10 and pin connector 30 in place. In some other embodiments of the present invention, other suitable means for fastening the connector enclosure 10 and the pin connector 30, including, but not limited to, adhesion using glues, adhesives, and any other suitable methods, may be used.

As can be seen in FIG. 5, in an alternative embodiment of the present invention, the plurality of pins 19 of the first tab 18 of the connector enclosure 10 comprises two pins, one of which is connected to the center plug 32 of the pin connector 30 and the other pin to one outer plug of the plurality of outer plugs 33 of the pin connector 34. As can be seen in FIG. 4 to FIG. 5, in some embodiments of the present invention, the first tab 18 and the second tab 21 of the connector enclosure 10 are electrically insulated from each other inside the cavity frame. Additionally, the connector enclosure 10 comprises the back slot 27, which is terminally positioned on the connector enclosure 10 opposite the front face 35 of the pin connector 30. The plurality of solar cells 71 of the solar module 70 is electrically connected to the first tab and the second tab through the back slot of the connector enclosure. Thus, the back slot 27 provides a convenient access to the first tab 18 and the second tab 21 for connecting the plurality of solar cells 71 of the plurality of solar modules 70. The back slot 27 may be covered and/or sealed after connections are completed through means including, but not limited to, adhesion using glues, adhesives, mechanical fastening, etc.

Figure 9:
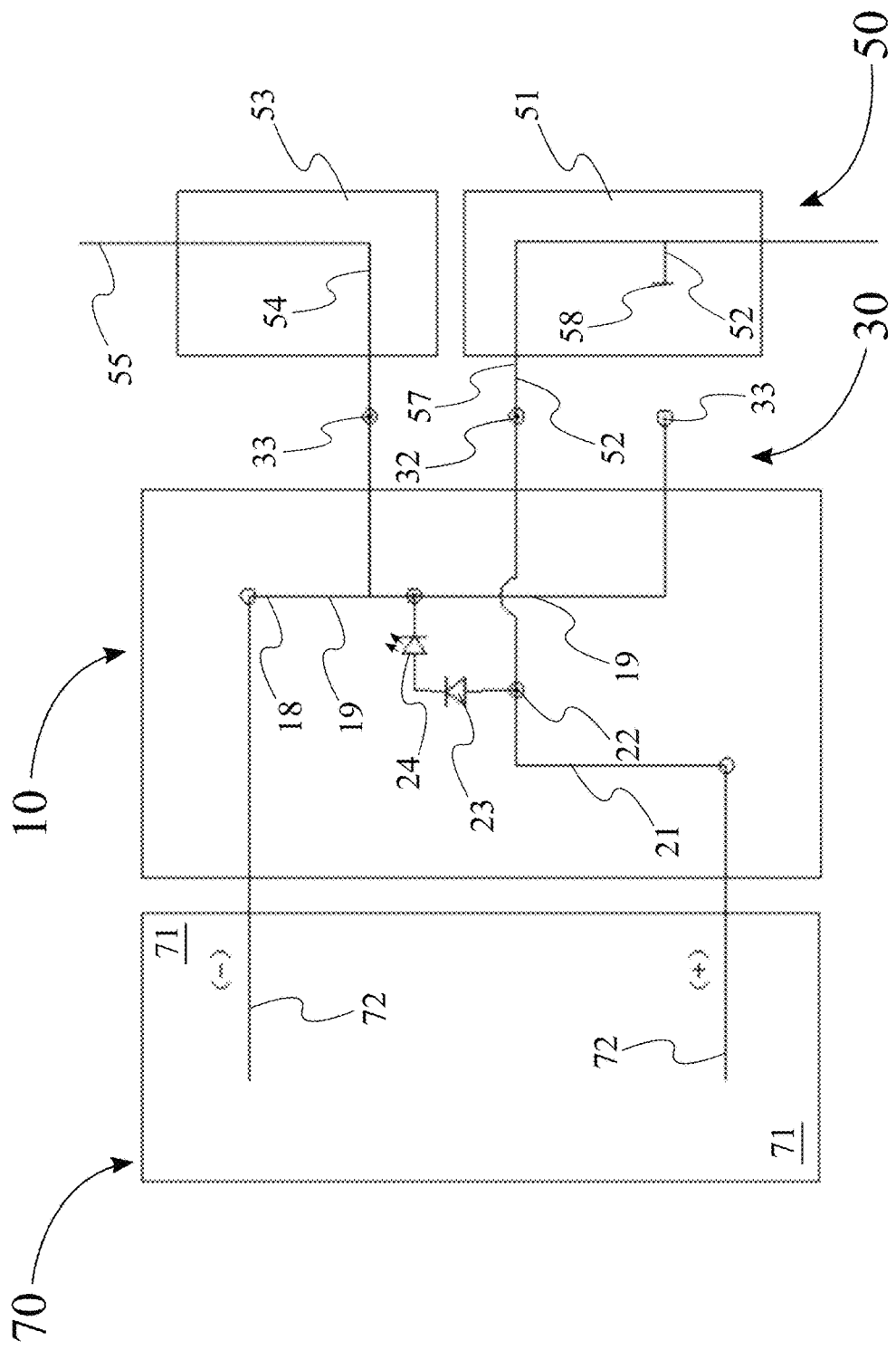
FIG. 9 is an electrical diagram of the present invention.

As can be seen in FIG. 5 and FIG. 9, the connector enclosure comprises the at least one bypass diode 23 and the LED light 24. More specifically, the at least one bypass diode 23 is internally positioned in the center cavity 17 of the main frame 15. The at least one bypass diode 23 is electrically connected to the first tab 18 and the second tab 21. The at least one bypass diode 23 may be any regular and suitable common solar bypass diode that keeps current of the generated solar power flowing in one direction and prevents this current from flowing back to the solar modules when the solar module is shaded and not generating electricity. The LED light 24 is internally positioned in the center cavity 17 of the main frame 15 adjacent the at least bypass diode 22. Additionally, the LED light 23 is electrically connected to the at least one bypass diode and adapted to emit alert light whenever the at least one bypass diode fails and/or malfunctions.

As can be seen in FIG. 1 to FIG. 3, and FIG. 7 to FIG. 8, in an alternative embodiment, the plurality of solar modules 70 comprises a sun-facing face 73 and a back face 74. More specifically, the sun-facing face 73 is terminally positioned on the plurality of solar modules 70 opposite the module base 90. The back face 74 is terminally positioned on the plurality of solar modules 70 opposite the sun-facing face 73. The connector enclosure 10 is attached to the back face 73 of the plurality of solar modules 70. The connector enclosure 10 may be attached to the specific solar module 70 through means including, but not limited to, glue, adhesive, mechanical fastening, etc., thus providing flexibilities to the user to install the present invention to a desired location of the solar system via any desired method.

As can be seen in FIG. 4 to FIG. 5, and FIG. 9, the cable assembly 50 comprises a first end 51, and a second end 53. The first end 51 is terminally positioned on the cable assembly 50, and the second end 53 is terminally positioned on the cable assembly 50 opposite the first end. The plurality of cable plugs 52 is positioned at the first end 51. The end plug 54 is positioned at the second end 53. Additionally, the plurality of cable plugs 52 comprises an active connector 57 and at least one inactive connector 58. The active connector 57 is electrically connected to the wire 55, while the at least one inactive connector 58 is not electrically connected to the wire 55, thus providing on a physical connection and/or attachment of the at least one inactive connector of the plurality of cable plugs 52. The active connector 57 is connected to the center plug 32 of the pin connector 30 while the at least one inactive connector 58 is connected to the corresponding plugs of the plurality of outer plugs 33 of the pin connector 30. The direction of the cable can be reversed left to right or right to left, without compromising reliability, performance, or safety. Regardless of which direction the modules are connected together, the solar PV system performance is not impacted. This configuration and structure of the connector apparatus of the present invention provides the fail proof installation of the solar PV modules for the solar system. The specific plug being electrically inactive provides the efficient and effective wiring method that not only substantially reduce the required labor hours and system complexity, but also prevents many problems/faults such as circuit shorts, open circuits, potential burns, etc.

Although the invention has been explained in relation to its preferred embodiment, it is to be understood that many other possible modifications and variations can be made without departing from the spirit and scope of the invention as hereinafter claimed.

What is claimed is:

1. A fail proof electrical connector apparatus for solar photovoltaic systems comprising:
a connector enclosure;
a pin connector;
a plurality of solar modules;
a module base;
the plurality of solar modules being mounted on the module base;
the connector enclosure being attached to the module base adjacent to a specific solar module;
the connector enclosure comprising a first tab and a second tab;
both the first tab and the second tab being electrically connected to the specific solar module;
the pin connector comprising a center plug and a plurality of outer plugs;
the center plug being centrally positioned on the pin connector;

the plurality of outer plugs being distally positioned on the pin connector adjacent the center plug;

the center plug being connected to the second tab of the connector enclosure; and the plurality of outer plugs being connected to the first tab of the connector enclosure.

2. The fail proof electrical connector apparatus for solar photovoltaic modules comprising as claimed in claim 1, wherein the center plug and the plurality of plugs are adapted to have opposite polarities of electricity.

3. The fail proof electrical connector apparatus for solar photovoltaic modules comprising as claimed in claim 1 comprising:

the plurality of solar modules being distributed across the module base;

the plurality of solar modules comprising a plurality of solar cells;

each of plurality of solar cells comprising a plurality of cell tabs;

the plurality of cell tabs of approximately half the number of the plurality of solar cells being connected to the first tab of the connector enclosure; and the plurality of cell tabs of the remaining solar cells being connected to the second tab of the connector enclosure.

4. The fail proof electrical connector apparatus for solar photovoltaic modules comprising as claimed in claim 1 comprising:

the connector enclosure comprising a cover, a cavity frame, a main frame, a center cavity;

the cover being terminally mounted to the connector enclosure;

the main frame being terminally mounted to the connector enclosure, opposite the cover;

the center cavity being centrally positioned on the main frame;

the cavity frame being securely mounted between the cover and the main frame;

the cavity frame comprising a tab cavity; and both the first tab and the second tab being internally positioned in the tab cavity.

5. The fail proof electrical connector apparatus for solar photovoltaic modules comprising as claimed in claim 4 comprising:

the first tab comprising a plurality of pins;

the plurality of pins being distally positioned on the first tab;

the second tab comprising a second tab pin;

the second tab pin being terminally positioned on the second tab; and both the plurality of pins and the second pin being internally positioned in the center cavity of the main frame.

6. The fail proof electrical connector apparatus for solar photovoltaic modules comprising as claimed in claim 5 comprising:

the pin connector comprising a pin connector body;

the pin connector body comprising a front face and a top face;

both the center plug and the plurality of outer plugs being terminally positioned on the front face;

the top face being positioned on the pin connector body normal to and adjacent the front face;

the pin connector being mounted to the connector enclosure through the top face being securely mounted between the main frame and the cavity frame;

each of the plurality of pins of the first tab of the connector enclosure being connected to a corresponding outer plug of the pin connector; and the second tab pin of the second tab of the connector enclosure being connected to center plug of the pin connector.

7. The fail proof electrical connector apparatus for solar photovoltaic modules comprising as claimed in claim 6 comprising:

the connector enclosure comprising a back slot;

the back slot being terminally positioned on the connector enclosure opposite the front face of the pin connector; and the plurality of solar cells of the solar module being electrically connected to the first tab and the second tab through the back slot of the connector enclosure.

8. The fail proof electrical connector apparatus for solar photovoltaic modules comprising as claimed in claim 4 comprising:

the plurality of pins of the first tab of the connector enclosure comprising two pins;

one of the two pins being connected to the center plug of the pin connector; and the other pin being connected to one outer plug of the pin connector.

9. The fail proof electrical connector apparatus for solar photovoltaic modules comprising as claimed in claim 4 comprising:

the connector enclosure comprising at least one bypass diode;

the at least one bypass diode being internally positioned in the center cavity; and the at least one bypass diode being electrically connected to the first tab and the second tab.

10. The fail proof electrical connector apparatus for solar photovoltaic modules comprising as claimed in claim 9 comprising:

the connector enclosure comprising a light-emitting diode (LED) light;

the LED light being internally positioned in the center cavity;

the LED light being electrically connected to the at least one bypass diode; and the LED light being adapted to emit alert light upon failure of the at least one bypass diode fails.

11. The fail proof electrical connector apparatus for solar photovoltaic modules comprising as claimed in claim 1, wherein the first tab and the second tab of the connector enclosure being electrically insulated from each other inside the cavity frame.

12. The fail proof electrical connector apparatus for solar photovoltaic modules comprising as claimed in claim 1 comprising:

a cable assembly;

the cable assembly comprising a plurality of cable plugs, an end plug, and a wire;

the end plug being terminally positioned on the wire;

the plurality of cable plugs being distally positioned on the wire, opposite the end plug;

the plurality of cable plugs being connected to the center plug and a corresponding plug of the plurality of outer plugs of the pin connector; and the end plug being connected to a vacant plug of the plurality of outer plugs of the pin connector mounted on the connector enclosure of an adjacent solar module of the specific solar module.

13. The fail proof electrical connector apparatus for solar photovoltaic modules comprising as claimed in claim 12 comprising:

the plurality of cable plugs comprises an active connector and at least one inactive connector;

the active connector being electrically connected to the wire;

the at least one inactive connector being electrically disconnected to the wire;

the active connector being connected to the center plug of the pin connector; and the at least one inactive connector being connected to the corresponding plugs of the plurality of outer plugs of the pin connector.

14. The fail proof electrical connector apparatus for solar photovoltaic modules comprising as claimed in claim 1 comprising:

the plurality of solar modules comprising a sun-facing face and a back face;

the sun-facing face being terminally positioned on the plurality of solar modules opposite the module base;

the back face being terminally positioned on the plurality of solar modules opposite the sun-facing face; and the connector enclosure being attached to the back face of the plurality of solar modules.

15. A fail proof electrical connector apparatus for solar photovoltaic systems comprising:

a connector enclosure;
a pin connector;
a plurality of solar modules;
a module base;
a cable assembly;

the plurality of solar module being mounted on the module base;

the plurality of solar module being distributed across the module base;

the connector enclosure being attached to the module base adjacent to a specific solar module;

the connector enclosure comprising a first tab and a second tab;

both the first tab and the second tab being electrically connected to the specific solar module;

the pin connector comprising a center plug and a plurality of outer plugs;

the center plug being centrally positioned on the pin connector;

the plurality of outer plugs being distally positioned on the pin connector adjacent the center plug;

the center plug being connected to the second tab of the connector enclosure;

the plurality of outer plugs being connected to the first tab of the connector enclosure;

the cable assembly comprising a plurality of cable plugs, an end plug, and a wire;

the end plug being terminally positioned on the wire;

the plurality of cable plugs being distally positioned on the wire, opposite the end plug;

the plurality of cable plugs being connected to the center plug and a corresponding plurality of outer plugs of the pin connector; and the end plug being connected to a vacant plug of the plurality of outer plugs of the pin connector mounted on the connector enclosure of an adjacent solar module of the specific solar module.

\* \* \* \* \*